United States Patent [19]

Becker et al.

[11] Patent Number: 4,604,027

[45] Date of Patent: Aug. 5, 1986

[54] MANIPULATOR OF ARTICLES AND METHODS OF MOVING ARTICLES OVER AN EXTENDED DISTANCE

[75] Inventors: Alan R. Becker, Coopersburg; Richard A. McCorkle, Allentown; Robert A. Miller, Easton; Gary J. Plessl, Allentown, all of Pa.

[73] Assignee: AT&T Technologies, Inc., Berkeley Heights, N.J.

[21] Appl. No.: 622,902

[22] Filed: Jun. 21, 1984

[51] Int. Cl.$^4$ .............................................. B65G 25/00
[52] U.S. Cl. .................................. 414/749; 74/89.15; 901/16; 248/651; 248/657
[58] Field of Search ............................ 414/749–753; 901/16; 248/651, 657; 74/89.15

[56] References Cited

U.S. PATENT DOCUMENTS

| | | | |
|---|---|---|---|
| 2,654,165 | 10/1953 | Lichtenberg | 74/89.15 |
| 3,734,303 | 5/1973 | Blatt | 414/753 |
| 3,884,363 | 5/1975 | Ajlouny | 414/751 |
| 4,466,770 | 8/1984 | Peroutky | 414/749 |

Primary Examiner—Joseph E. Valenza
Attorney, Agent, or Firm—James H. Fox; W. O. Schellin

[57] ABSTRACT

Apparatus (11), which includes two adjacent wafer treating facilities (21 and 22), features an overhead positioning mechanism (20), the operation of which is controlled by a control module (48) to handle articles, such as semiconductor wafers (16), in a plurality of sequential plating operations. The vertical movement of a manipulator extension (46) is controlled with a relatively greater degree of precision to protect the wafers from becoming damaged. In the horizontal direction, a traveling frame (106) steadies a lead screw (59) spanning an extended distance between the two facilities (21 and 22) to support a precise movement of the manipulator extension (46) with respect to both of the facilities.

1 Claim, 6 Drawing Figures

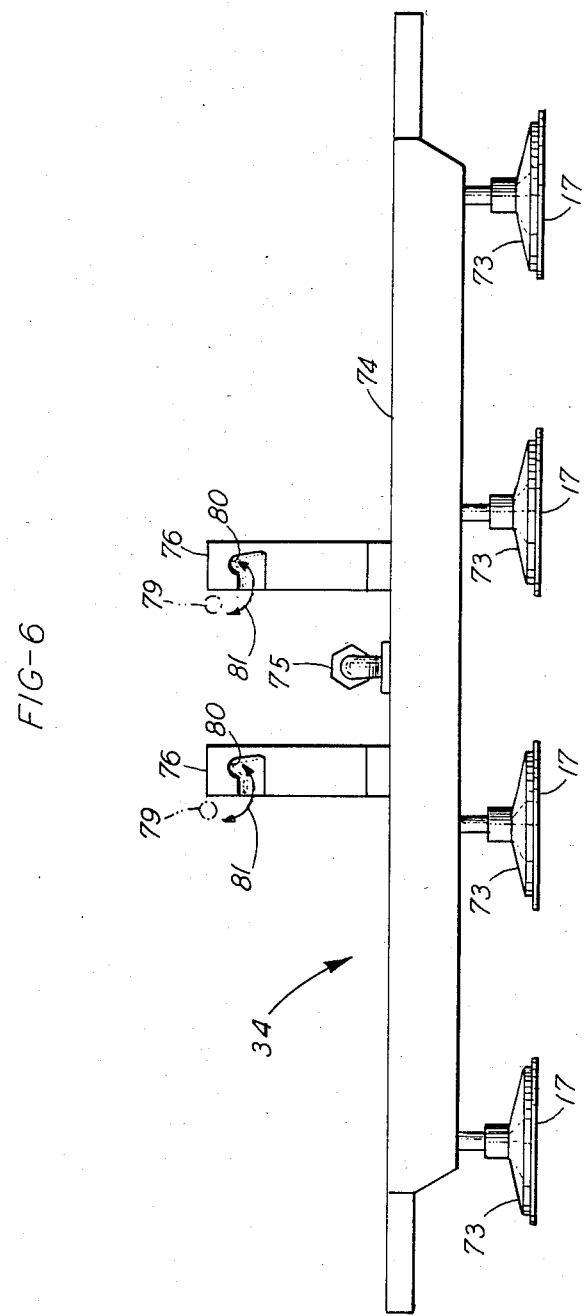

MANIPULATOR OF ARTICLES AND METHODS OF MOVING ARTICLES OVER AN EXTENDED DISTANCE

TECHNICAL FIELD

The present invention relates to a manipulator having three-dimensional, controllable motion for handling articles within a predetermined space. The invention relates particularly to a manipulator having a range of motion spanning an extended distance over which intermediate supports become desirable.

BACKGROUND OF THE INVENTION

The manipulator, as described herein, is controllable by state-of-the-art programmable controls. In combination with such programmable controls, the described manipulator becomes a robotic apparatus which duplicates by preprogrammed control commands handling operations which in the past have been performed by operators as manual operations. In efforts to avoid manual handling procedures in typically ultra-clean environments of integrated circuit manufacturing operations, it appears desirable to apply the operation of such a manipulator to handling semiconductor wafers in certain process steps, as, for example, a typical plating operation. Handling semiconductor wafers relative to a plating operation typically involves unloading the wafers, one by one, from a wafer magazine wherein the wafers are stored in a parallel, rather closely spaced arrangement, and transferring them to a plating rack. When held by the plating rack, the wafers are placed into a plating tank wherein they remain for a predetermined period. Thereafter, the wafers are rinsed and are then transferred from the plating rack to another magazine.

One of the problems encountered in attempts to use a manipulator for handling semiconductor wafers in connection with, for example, the described plating operation, relates to locating each of the wafers in the referred-to magazines by preprogrammed three-dimensional motion of the manipulator. The wafers are typically in a range of three to five inches in diameter, but are only about 0.020 inch thick. Detecting the presence or absence of contact between a wafer of such thickness and a handling tool presents a problem.

Another problem of using the manipulator in handling wafers with respect to the referred-to plating operation relates to inefficiencies which arise out of prolonged plating periods in each plating cycle during which the manipulator remains idle. If such idle periods can be used by the manipulator to perform added operations, the cost of the manipulator may be averaged over all of its performed operations for a lower average cost per operation. It is, therefore, desirable to extend the operation of the manipulator to perform similar handling operations with respect to a second plating facility. Such added operation, however, enlarges the space which the manipulator needs to traverse. Mechanical tolerances and vibrations in an extended range of motion have been found to become a problem unless the sizes of the moving mechanisms are appropriately increased for such extended range of motion. However, increased sizes of mechanical components also increase the weight and the cost of an apparatus. It is also more difficult to maintain dimensional precision in relatively larger apparatus components. The problem is one of an incompatible range of motion in at least one direction or dimension with respect to the range of motion in the apparatus in another dimension.

SUMMARY OF THE INVENTION

A manipulator, in accordance with the invention, has an extended range of controlled motion in at least one direction. Accordingly, the manipulator features a manipulator head which is movable over a predetermined first distance spanning such extended range of motion. A structural element capable of moving the manipulator head along such first distance extends longitudinally at least over such first distance and into engagement with the manipulator head at an intermediate position along such first distance. The engagement of the structural element with the manipulator head divides such element into first and second portions. A support structure is mounted for movement over a second distance in the direction of the extent of and in supportive engagement with the first and second portions of the structural element to support such element. The support structure is capable of shifting the positions of its engagement with the first and second portions of the first structure to support the longer portion of the structural element in an intermediate position such that none of the portions exceeds an undesirably long unsupported length.

A method in accordance with the invention includes moving a manipulator head for a predetermined distance along a longitudinally extending structural member such that a current position of the manipulator head divides the member into two portions. The method further includes supporting both portions of the member with a movably mounted support structure and shifting the positions at which the support structure engages the member, such that the longer of the two portions of the structural member is supported in a central position and none of the portions exceeds an undesirably long unsupported length.

BRIEF DESCRIPTION OF THE DRAWING

The various features and advantages of the invention will be best understood when the following detailed description of an embodiment of the invention is read in reference to the appended drawing, wherein:

FIG. 6 shows details of a manipulator attachment with the capability of simultaneously holding a plurality of articles such as semiconductor wafers.

DETAILED DESCRIPTION

The Apparatus In General

Figure 1:
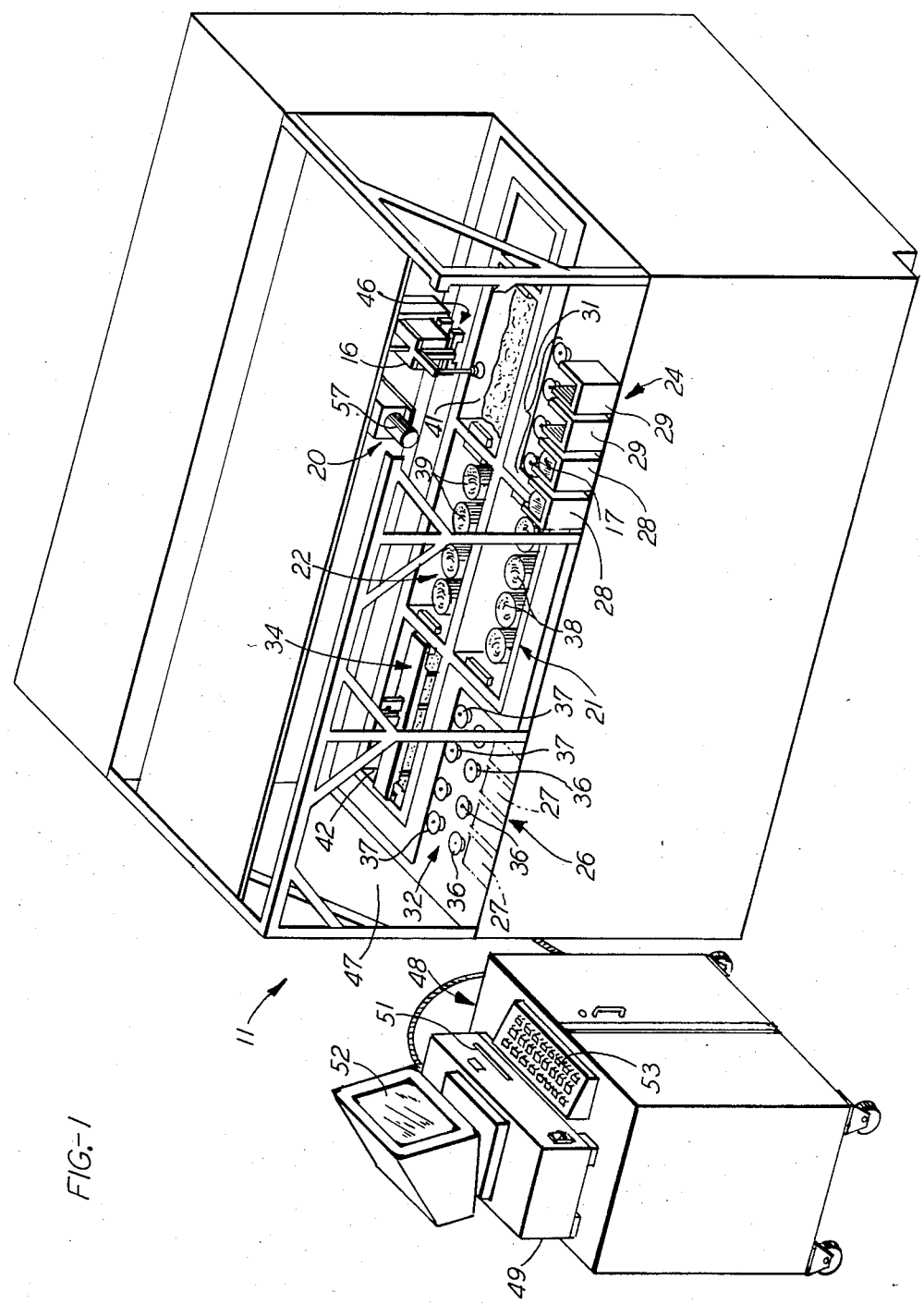
FIG. 1 shows an overall view of an article treating apparatus which features an embodiment of the present invention.

FIG. 1 is an overall view of apparatus 11, such as a semiconductor plating apparatus, which is described herein as incorporating a preferred embodiment of the invention. The plating apparatus 11 shown in FIG. 1 features a manipulator head 16 which is capable of executing tasks of precisely controlled motion to handle semiconductor wafers 17 with respect to two plating operations. In the past, such handling operations were performed by operators who could pace various handling movements to handle the wafers 17 with respect to two simultaneous plating operations and who could readily step back and forth between two similar plating facilities to perform the various handling operations with respect to the wafers at each of such two facilities.

The manipulator is a three-axes positioning mechanism designated generally by the numeral 20, which advantageously combines a precision of movement for safely handling the wafers 17 over an extended range of motion which allows the manipulator head 16 to move between adjacent first and second plating facilities 21 and 22, respectively. Each of the plating facilities 21 and 22 includes a wafer magazine support area identified by numerals 24 and 26, respectively. The magazine support areas 24 and 26 precisely locate in dedicated locator seats 27 wafer load magazines 28 from which wafers 17 are loaded into the apparatus 11, and wafer unload magazines 29, which receive the wafers 17 when they are unloaded from the respective plating facilities 21 and 22 after the wafers have been plated. In the described embodiment, each of the magazine support areas 24 and 26 has, as a matter of preference, provisions for two of the load magazines 28 and two of the unload magazines 29.

Staging areas 31 and 32 located adjacent to the respective magazine support areas 24 and 26 temporarily hold the wafers 17 after they are taken sequentially from one of the load magazines 28 to be picked up as a group by one of two wafer holders 34 of the plating apparatus 11. Only one of the wafer holders 34 is shown in FIG. 1 in a convenient storage position. However, each of the plating facilities uses one of such wafer holders 34 during its operation to manipulate a plurality of the wafers 17 simultaneously as a group. In the preferred embodiment, four of the wafers 17 are placed on side-by-side arrayed pickup seats 36 from where they are picked up in a group by the respective wafer holder 34 which is associated with each of the plating facilities 21 and 22. Each of the staging areas 31 and 32 includes four additional seats 37 to which the wafers 17 are released by the wafer holder 34 after plating.

The first and second plating facilities 21 and 22 include plating provisions such as fountain plating heads 38 and 39, respectively, and typical rinsing tanks 41 and 42, respectively. The plating cycles of both groups of plating heads 38 and 39 are a single power source (not shown) controlled to turn on simultaneously and remain activated for the same length of time. Of course, the simultaneous activation of the plating cycles of both facilities 21 and 22 is one of choice and could be changed without affecting this invention.

Operation Of The Apparatus

The positioning mechanism 20 has a capability of moving an extension 46 on the manipulator head 16 along predetermined paths and into predetermined positions within the confines of a space 47 above the plating facilities 21 and 22. A motion control console 48 includes a typical programmable microcomputer control system designated generally by the numeral 49, such as a Multibus System, which is available from Intel, Inc. The control system 49 is based on an Intel 8085 microprocessor. Program instructions are preferably provided by a ROM (Read Only Memory). Instructions could also be loaded into the system's memory in machine language through a typical input-output device such as a floppy disk drive 51. An operator receives instructions and information from the control system 49 on a typical CRT screen 52 and has the opportunity to enter information or control commands via a keyboard 53. Preferably, the control system 49 and the keyboard 53 are located sufficiently removed from the plating facilities 21 and 22 to be shielded from splatter caused by the plating operations. Of course, if the handling operations of the positioning mechanism 20 were performed in a non-corrosive environment, it might be preferred to incorporate the control console into the apparatus 11.

Handling operations are executed in a preprogrammed sequence which follows commands from the control system 49. Three-dimensional motion of the manipulator extension 46 occurs, in the described embodiment, in response to an activation of one or more of three stepping motors 56, 57 or 58 which rotationally drive respective lead screws 59, 60 or 61 (see FIGS. 3 and 4). Typical helical grooves along the lead screws 59, 60 and 61 are engaged by corresponding ball slides 63, 64 and 65 to advance the manipulator extension 46 in one or the other direction along at least one of the lead screws 59, 60 or 61. The stepping motors 56, 57 and 58 are commercially available products, as for example, from Superior Electric Company, Bristol, Conn. The motors 56, 57 and 58 may, for example, be obtained complete with control circuits mounted on circuit cards which are command-compatible with the Multibus System and which are readily inserted into circuit connectors of the Multibus System to become part of the control system 49.

Figure 2:
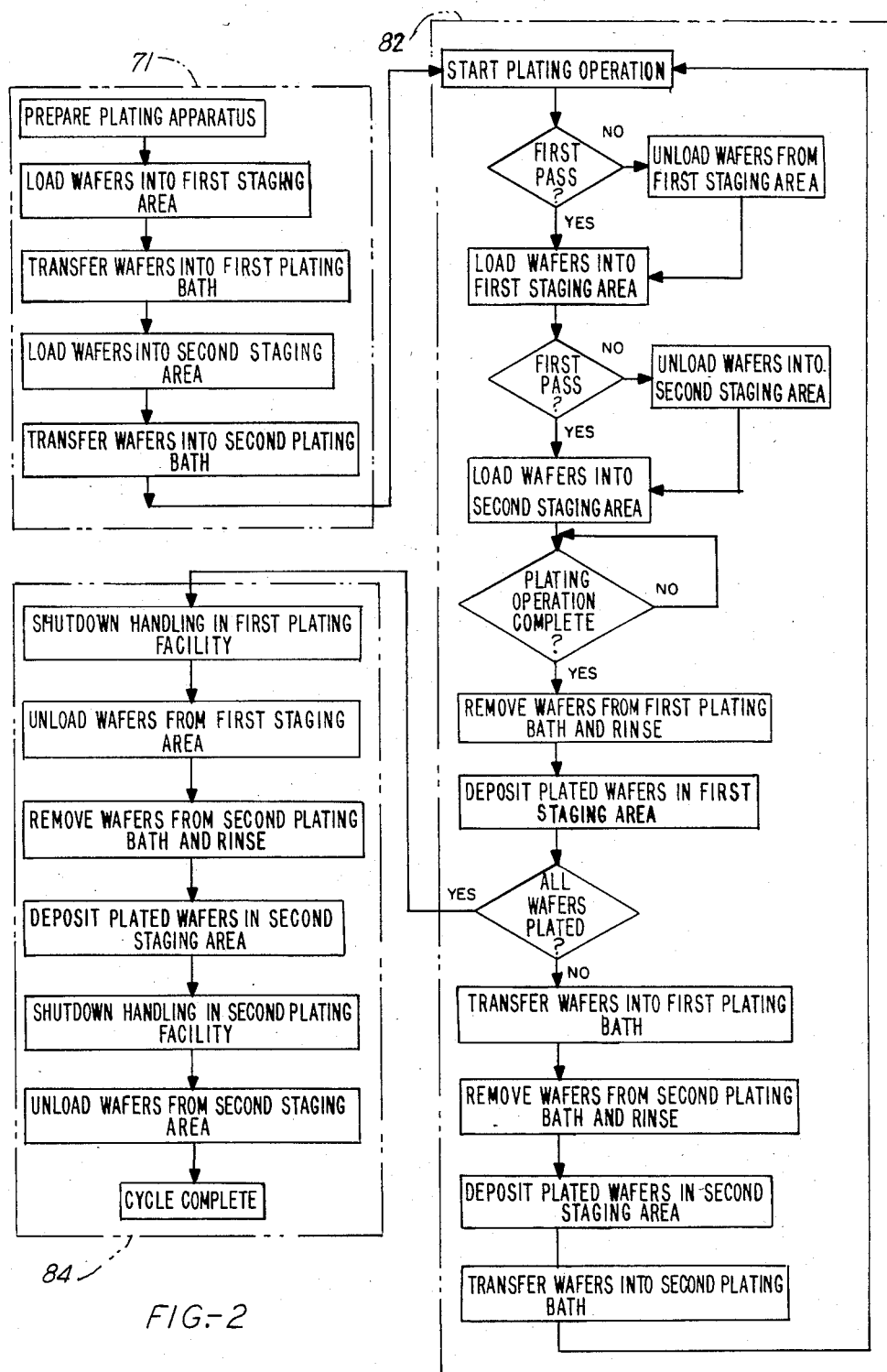
FIG. 2 shows a flow diagram of the mode of operation of a treating apparatus such as the apparatus of FIG. 1, which is in the described example a plating apparatus for semiconductor wafers.

A preferred operating sequence of the apparatus 11 is best described in reference to FIG. 1 and to the flow diagram of FIG. 2. Before the control of the apparatus 11 is turned over to the control system 49, an operator "initiates the plating operation" by first placing an appropriate number of load magazines 28 and unload magazines 29 into the respective locator seats 27 of the magazine supports 24 and 26, as shown in FIG. 1. The programmed control mode of operation of the apparatus 11 is then activated, such as by entering an appropriate start command, through the keyboard 53. The programmed control mode runs through a first start-up sequence 71 wherein the wafers 17 are loaded, one by one, from a first load magazine 28 at the first plating facility 21 onto the pickup seats 36 of the staging area 31 of such first plating facility 21. The wafers 17 are then transferred as a group from the pickup seats 36 of the first staging area into the plating bath 38 of the first plating facility 21. The wafer holder 34, shown best in FIG. 6, is retrieved by the manipulator extension from a storage position to pick up the wafers 17 as a group. In the preferred embodiment, the wafer holder 34 has four vacuum holders 73 which are coupled through a common manifold chamber 74 to a vacuum source 75 of the apparatus 11. A hook-type coupler 76 matches a clamping socket 77 on the manipulator extension 46 (see FIG. 5), such that a circular motion executed by the manipulator extension 46, followed by clamping jaws 78, inserts pins 79 into appropriate recesses 80 in the couplers 76 of the wafer holder 34 to securely couple the wafer holder temporarily as a manipulator attachment 34 to the extension 46.

The manipulator head, after transferring the attachment 34 with a group of wafers 17 to the respective plating heads 38 of the first plating facility 21, releases the attachment holding the wafers 17 by first releasing the grip of the jaws 78 and then executing a small circular movement to slip the pins 79 out of the respective recesses 80 in the couplers 76. Arrows 81 in FIG. 6 show the engaging and disengaging motion by the pins 79 with respect to the couplers 76.

Referring to FIGS. 1 and 2, the manipulator head now traverses the length of the apparatus 11 to the second plating facility 22 to repeat the just completed handling operations with respect to such second plating facility 22. When the second group of wafers 17 have been transferred to the second plating heads 39, the start-up sequence is completed and the plating operation is started for a first pass or first cycle of a plating sequence 82 as shown in FIG. 2.

The first pass through the plating sequence 82 differs from subsequent passes in that plated wafers 17 have not yet been removed from the plating baths and have not yet been deposited on the secondary seats 37 of the staging areas 31 and 32. Thus, on the first pass through the plating sequence 82, wafers 17 are not unloaded from the staging areas 31 and 32 to be returned to respective unload magazines 29. On second and subsequent passes through the plating sequence 82, the manipulator extension 46 unloads the plated wafers 17 from the seats 37 in the staging areas 31 or 32 into the unload magazines 29. Thereafter, yet unplated wafers 17 are loaded from the load magazines 28 into the pickup seats 36 of the respective first and second staging areas 31 and 32.

The final pass through the plating sequence 82 differs from previous passes in that the manipulator extension 46 recognizes when the load magazines 28 have been emptied and causes a flag to be set at that time. The test "All wafers plated?" is then answered in the affirmative and the program branches from the plating sequence 82 and starts a third sequence which is referred to as a shutdown sequence 84.

During the shutdown sequence 84, the manipulator head 16 moves to return the first manipulator attachment 34, which is now no longer needed, to its storage position, as, for example, to the rinsing tank 41 of the respective plating facility 21. The wafers 17 which were deposited in the first staging area by the manipulator attachment are now sequentially unloaded by the manipulator extension 46 into the unload magazine 29 at the first plating facility 21. Unloading the wafers 17 completes the handling operations at the first plating facility 21. The manipulator head now traverses over to the adjacent plating facility 22 to complete its handling operations with respect to the second facility before terminating its programmed operations cycle.

At the second plating facility, the manipulator extension attaches itself in the already described manner to the manipulator attachment 34 associated with the second facility 22 to remove the remaining wafers 17 from the second plating bath and to deposit the wafers 17 in the staging area 32 of the second plating facility 22. The manipulator attachment associated with the second facility 22 is then stored in the rinsing tank 42 and the remaining wafers 17 are unloaded from the staging area 32 into the respective unload magazine 29 to complete the programmed routine of the apparatus 11.

It should be noted that horizontal positioning errors during the various transfer operations on the wafers 17 could accumulate, so that a high degree of accuracy in positioning the manipulator head 16 is desirable to augment a vertical positioning accuracy of the manipulator extension 46 as a factor in avoiding damage to the wafers 17 during the above-described handling operations.

The Positioning Mechanism

Figure 3:
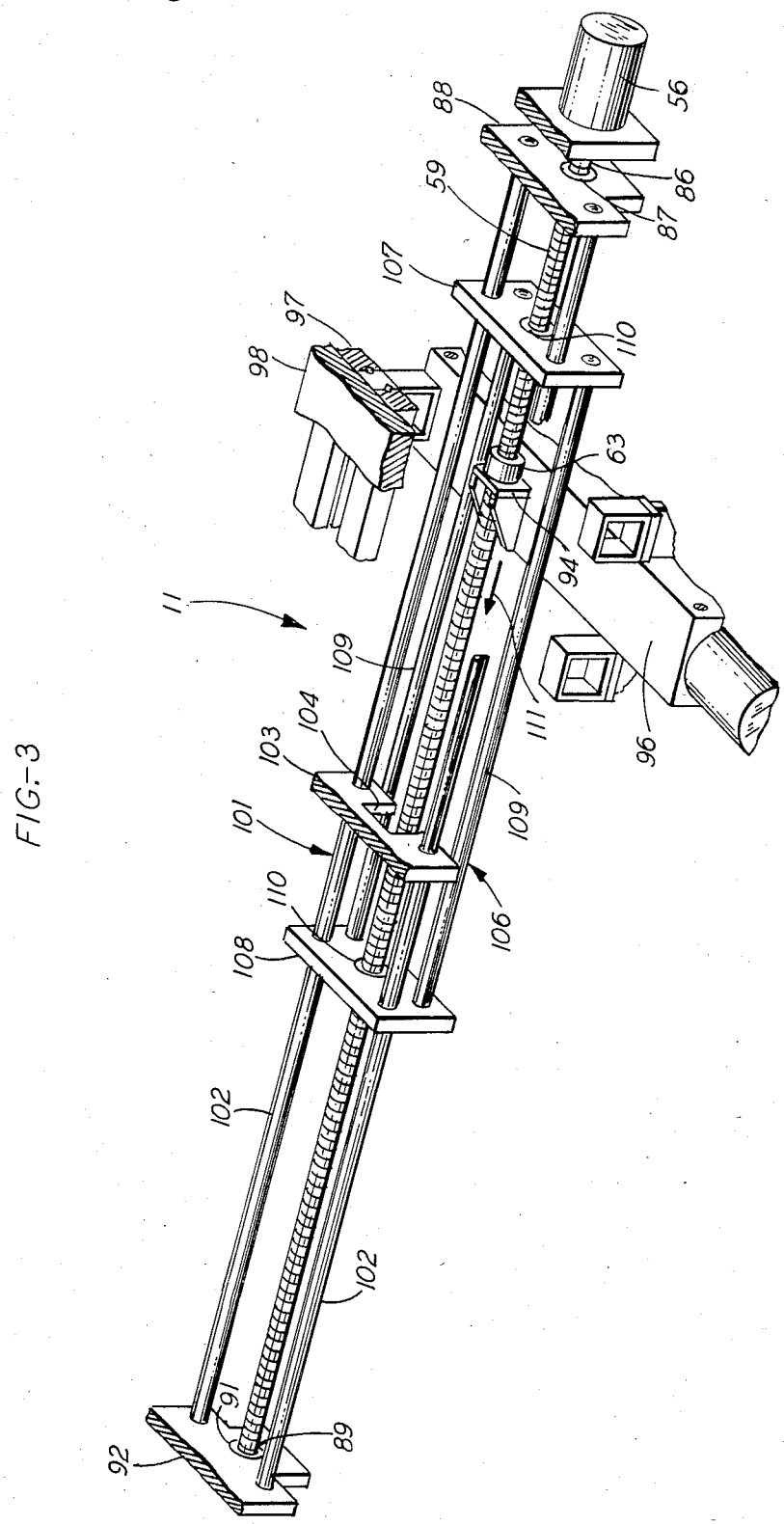
FIG. 3 shows in greater detail portions of a horizontal drive mechanism of the apparatus shown in FIG. 1.

A support structure which permits the lead screw 59 to extend over a travel distance between the two plating facilities 21 and 22 is shown in greater detail in FIG. 3. The lead screw 59 is coupled at a first end 86 to the stepping motor 56 and is rotatably supported at such first end 86 in a bearing 87 of a fixedly mounted support bracket 88. A second end 89 of the lead screw 59 is similarly supported in a bearing 91 to rotate in a fixed end bracket 92. The unsupported length of the lead screw 59 between the two bearings 87 and 91 allows the ball slide 63 to travel along substantially the entire length of the lead screw 59. The ball slide 63 is mounted in a gusset-supported lug 94 on an upper surface of a slide frame 96 from which the manipulator head 16 depends. The slide frame 96 is slidably supported by overhead bearing slides 97, the fixed track portions of which are rigidly mounted to the upper structure 98 of the apparatus 11.

In the described embodiment, the length of the lead screw 59 exceeds a length over which the lead screw stock as a structural member can unsupportedly extend without risk of being subjected to axial flexing which then brings about uncontrollable rotational vibrations. However, vibrations on the lead screw 59 are effectively avoided by a traveling frame mechanism 101 which allows the lead screw 59 to extend controllably over the entire width of the apparatus 11.

The frame mechanism 101 includes fixedly mounted rails 102 which extend parallel to the lead screw 59. The rails 102 are mounted at both ends through the brackets 88 and 92 to the upper structure 98 of the apparatus 11. A fixedly mounted supplemental center support 103, which depends from the upper structure 98, stabilizes the center of the rails 102. A cutout 104 in the center support 103 allows the top lug 94 to pass unhindered as the manipulator head 16 travels past the center support 103. The rails support a traveling frame 106. Two traveling support brackets 107 and 108, one of which is slidably mounted to the rails 102 on one side of the center support 103 and the other on the other side thereof, are spaced apart by longitudinal support rods 109. In the preferred embodiment, the distance between the two traveling support brackets 107 and 108 is substantially equal to the distance from the center support 103 to either of the end brackets 88 or 92. Consequently, when, for example, the traveling frame 106 is moved to the right extreme of its travel range, the traveling bracket 107 becomes located adjacent to the end bracket 88 while the other traveling bracket 108 moves into a position adjacent to the center support 103.

The ball slide 63 on the slide frame 96 is located in the space between the two traveling support brackets 107 and 108. Each of the traveling support brackets features a slide bearing 110 which allows free relative movement of the lead screw 59 in the longitudinal, i.e., the axial, direction of the lead screw while it restricts the movement of the lead screw in its radial direction, i.e., in a plane perpendicular to the longitudinal axis of the lead screw. Consequently, the lead screw 59 is supported in its radial direction along the span between the two bearings 87 and 89 by three axially movable supports, namely the ball slide 63 and the two slide bearings 110.

As the ball slide 63 advances, for example, out of an extreme, right hand position toward the left, the bracket 107 remains initially positioned adjacent to the fixed support bracket 88. During such initial advancement of the ball slide 63 toward the left, the second traveling support bracket 108 remains adjacent to the fixed center support 103 where it supports the lead screw 59. Consequently, there is no unsupported length of the lead screw which is longer than one-half of the entire length through which the lead screw 59 extends.

During the travel of the slide frame 96 toward the left hand side of the apparatus 11, as indicated by an arrow 111 in FIG. 3, the ball slide 63 is urged by the rotating lead screw away from the traveling support bracket 107 on right hand side of the traveling frame 106 and passes through the cutout 104 in the center support 103 into contact with the traveling support bracket 108. If the lead screw 59 continues to rotate and the ball slide 63 continues on toward the end bracket 92, the ball slide and its associated mounting brackets in contact with the traveling support bracket 108 urge the bracket 108 out of its central position toward the end bracket 92. But as the central support of the lead screw 59 by the bracket 108 is gradually shifted toward the left side, the traveling support bracket 107 moves similarly toward the left and assumes the function of supporting the lead screw 59 in a central, intermediate position along its length. As seen by referring to FIG. 3, the ball slide 63 is capable of moving along substantially the entire length of the lead screw 59, and, because of the accompanying shift of the slide bearings 110, no section of the lead screw 59 longer than one-half of its length remains unsupported at any one time during the movement of the ball slide 63.

Modifications

From the described features which are particularly advantageous to handling wafers with respect to two adjacent plating facilities, various other modifications come readily to mind which allow the features of the described positioning mechanism 20 to be adapted to other types of apparatus without departure from the present invention.

Of course, various changes and modifications come to mind with respect to the above-described traveling frame mechanism 101. For example, it is deemed within the scope of the present invention to suspend the slide frame 96 from the support rods 109 by, for example, typical ball slides. Such a modification may be particularly advantageous for a manipulator which operates with less precision in the vertical positioning of the manipulator extension than what is desired in the present operation of handling the wafers 16. Also, if more than one of the traveling support brackets 108 are used on each side of the slide frame 96, such added support brackets need to be flexibly interconnected, such as by folding links or by cables to allow the support brackets 108 to yieldably move out of the way of the moving slide frame 96 so as not to curtail its range of movement. As may already have been realized from the above description of the positioning mechanism 20, in reference to FIG. 4, a second traveling support frame mechanism 101 can readily be added to support movement along an extended slide frame 96. Such added structure would allow the travel range of the manipulator head 16 to be extended into the second horizontal dimension. With such additional range extension, the positioning mechanism 20 doubles its presently described range of operation.

Figure 4:
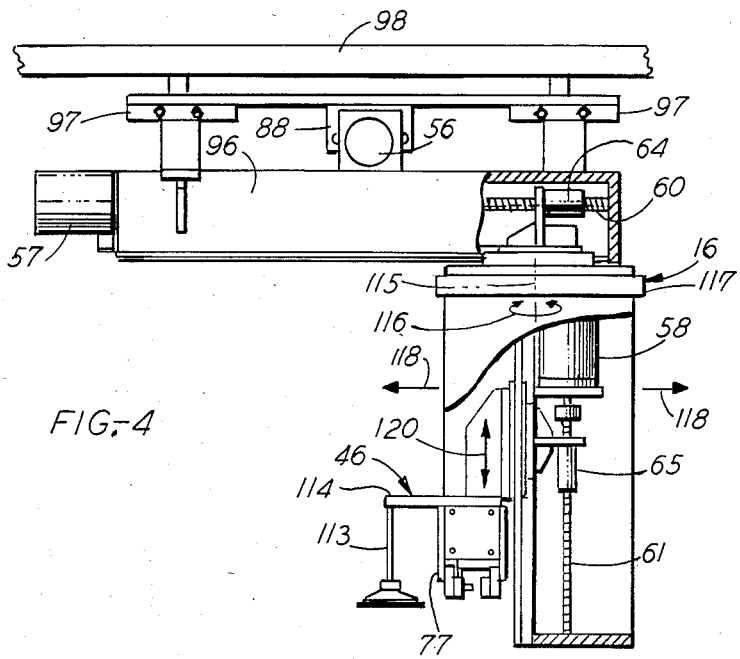
FIG. 4 is an end view of a manipulator head of the apparatus shown in FIG. 1.
Figure 5:
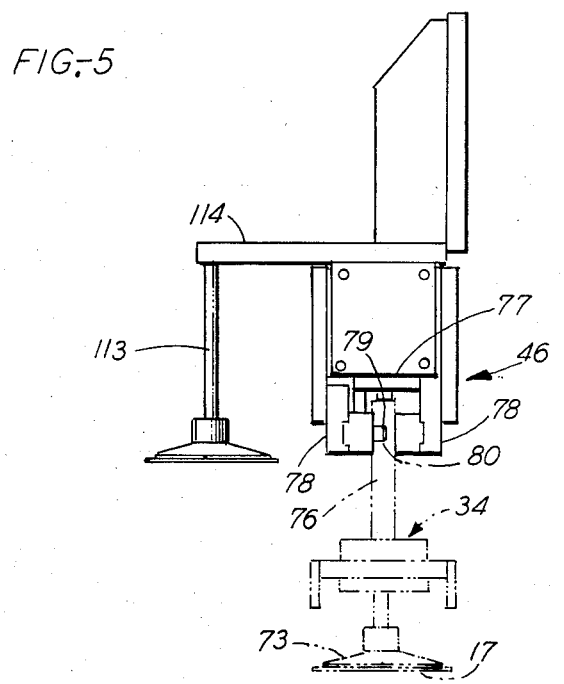
FIG. 5 shows a manipulator extension of the manipulator head shown in FIG. 4.

In reference to FIGS. 4 and 5, various modifications are seen possible in the function and operation of the manipulator extension 46. For example, the preferred structure of the manipulator extension 46 includes a non-removable vacuum pickup tool 113 which extends laterally on a support arm 114 from the clamping socket 77. Such a fixedly mounted vacuum pickup tool is preferred for the described operations because approximately eighty percent of the handling operations of the manipulator extension 46 involve handling one wafer at a time. Consequently, only one tool is needed to serve both plating facilities 21 and 22. The laterally extending support arm 114 allows top access of the pickup tool 113 to the magazines 28 and 29 (see FIG. 1), such that the magazines can be unloaded sequentially from the top and can be reloaded sequentially from the bottom. Another modification of the previously described apparatus is, for example, an inclusion of the capability for a rotational pivoting motion of the manipulator head 16 about a vertical axis 115 as indicated in FIG. 4 by the arrow 116. Such a pivoting motion may be superimposed on the already described horizontal motion in the direction of the arrow 116 to support manipulation of wafers 16 into or out of magazines which are located about the apparatus in different horizontal orientations. In addition, the rotational movement of the manipulator extension supports a horizontal reorientation of tools such as during retrieving, manipulating and storing of tools, other than the manipulator attachment 34 which may need to be used in a different mode of operation. One convenient way to rotate the head is by a conventional stepping motor 117 which is mounted into the upper end of the manipulator head 16.

FIG. 4 also shows the lead screw 61 and the corresponding ball slide 65 for positioning the 32 manipulator extension 46 in the vertical direction (as indicated by the arrow 120) to be of a smaller size and of a finer pitch than the lead screws 59 and 60 for positioning the manipulator head 16 in a horizontal plane. A related higher degree of precision for vertically positioning the pickup tool 113 relative to a typical movement of the tool in the horizontal direction is found desirable because of the flat shape of the wafers 16. Since in typical production wafers, the thickness is about two orders of magnitude smaller than the corresponding lateral dimensions, manipulation of the head 16 in the vertical direction advantageously has a higher degree of precision than if manipulation in the horizontal directions. In the preferred embodiment, the three stepping motors feature two hundred stepping positions per revolution. In the horizontal plane, two-pitch lead screws advance the manipulator head by 0.0025 inch per step. However, in the vertical direction, the advance of the manipulator head 16 is decreased by an eight-pitch lead screw to 0.000625 inch per step. This allows the vertical motion to be stopped within small increments after the pickup tool 113 contacts one of the wafers 16 from the top. Contact with the wafers 16 is preferably sensed by changes in the level of the vacuum drawn as a result of reduced leakage through the tool 113 after the tool contacts one of the wafers 16.

It appears reasonable that in an application of handling articles other than the wafers 16, wherein the thickness or height of the articles is similar to their length or width, modifying the lead screws to have equal pitches in all directions may be desirable. Or it may be desirable to more precisely control the movement in one of the horizontal directions if the wafers 16 are handled while in a vertical orientation. It is seen that changes and modifications are possible in various ways without departing from the spirit and scope of the invention.

What is claimed is:

1. A manipulator comprising:

a manipulator head (16) mounted for movement over a predetermined first distance;

first means (59) for moving the manipulator head along such first distance, such moving means extending longitudinally over at least such first predetermined distance and into engagement with such manipulator head at an intermediate position along such first distance, such engagement dividing the moving means into first and second portions;

means, mounted for movement in the direction of the longitudinal extent of and in supportive engagement with the first and second portions of said first moving means, for supporting said first moving means, said supporting means being capable of shifting the supportive engagement with the first moving means in the direction of a movement of the manipulator head within such first distance to support the longer of the first and second portions of the first moving means in a central position thereof, such that none of the first portions of the first moving means exceeds an undesirably long supported length;

a fixed frame structure including first and second end support brackets (88,92) located at one and the other end of such first distance, respectively, and guide rails (102) mounted to each of the first and second end support brackets and extending there between over said first distance, said guide rails being centrally supported by a fixed center support (103) mounted to said fixed frame structure, and wherein said means for supporting said moving means comprises a frame including two traveling support brackets (107,108), a first one of said traveling support brackets being movably mounted to the guide rails on one side of the center support and the second one being movably mounted to the guide rails on the other side of the center support, each of the traveling support brackets slidably engaging said first moving means to support said first moving means in a plane perpendicular to the longitudinal extent of the moving means, said traveling support brackets being spaced by longitudinal supports (109) of a length such that one of the traveling support brackets becomes located in proximity to the center support when the other of the traveling support brackets is located in proximity to the respective one of the first and second end support brackets.

* * * * *